June 21, 1966 G. W. LEUBNER ETAL 3,257,664

LIGHT-SENSITIVE POLYMERS

Filed Oct. 23, 1961

Fig. 1

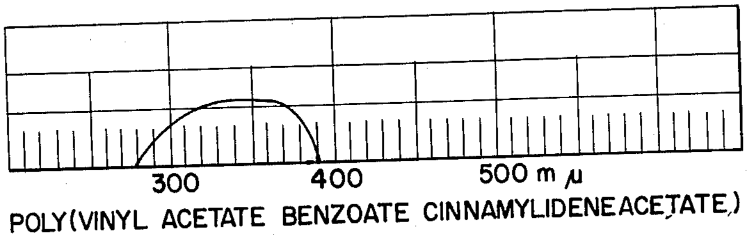

POLY(VINYL ACETATE BENZOATE CINNAMYLIDENEACETATE)

Fig. 2

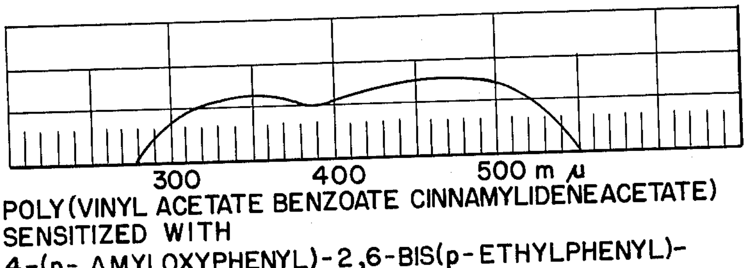

POLY(VINYL ACETATE BENZOATE CINNAMYLIDENEACETATE)
SENSITIZED WITH
4-(p- AMYLOXYPHENYL)-2,6-BIS(p-ETHYLPHENYL)-
THIAPYRYLIUM PERCHLORATE

Fig. 3

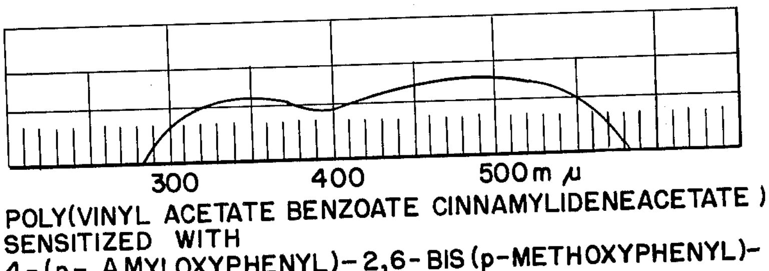

POLY(VINYL ACETATE BENZOATE CINNAMYLIDENEACETATE)
SENSITIZED WITH
4-(p- AMYLOXYPHENYL)-2,6-BIS(p-METHOXYPHENYL)-
THIAPYRYLIUM PERCHLORATE

GERHARD W. LEUBNER
CORNELIUS C. UNRUH
INVENTORS

BY R. Frank Smith
Ray Carter Livermore
ATTORNEY & AGENT

3,257,664
LIGHT-SENSITIVE POLYMERS

Gerhard W. Leubner and Cornelius C. Unruh, Rochester, N.Y., assignors to Eastman Kodak Company, Rochester, N.Y., a corporation of New Jersey Filed Oct. 23, 1961, Ser. No. 146,742
21 Claims. (Cl. 96—115)

This invention relates to light-sensitive polymers for projection speed photoresist materials and particularly to light-sensitive polymers containing recurring alkapolyenoate groups..

It is known in the art of photomechanical reproduction to utilize various materials such as bichromated shellac, albumen or polyvinyl alcohol for forming resist images upon various supports, such as metal plates. The support is then etched or otherwise treated in areas not covered by the resist image and the resultant plate usually after removal of the resist image, is used for printing. One method of forming relief images on metal supports is disclosed in the Murray U.S. Patent 1,965,710, granted July 10, 1934, and includes using as a sensitive layer for forming a resist image, a layer of cinnamal ketone containing another resinous material which after exposure to activating radiation under a design may be selectively dissolved in the unexposed area whereby the area of the support thus bared may be etched.

The use of sensitized cinnamic acid esters of polyvinyl alcohol as the radiation-sensitive polymer in compositions for coating photoresist materials has been described by Minsk et al. in U.S. Patent 2,610,120, granted Sept. 9, 1952.

Light-sensitive polymers known heretofore have usually been sensitive to radiation primarily in the ultra-violet regions of the spectrum. It is known to add sensitizing materials to these polymers in order to increase their overall sensitivity and also to increase their sensitivity to radiation of longer wavelengths toward the visible portion of the spectrum.

Many light-sensitive polymers available heretofore have not had the inherent sensitivity or have not been capable of being sensitized sufficiently, especially to radiation in the visible or near visible region of the spectrum. Increasing the sensitivity of such systems into the visible region of the spectrum has several advantages: It makes available inexpensive and convenient light sources, such as incandescent lamps, it reduces over-all exposure time, and allows projection printing through various optical systems. Projecting printing is necessary where image enlargement or reduction is required. Vacuum frames needed for contact printing are not required for projection printing.

It is, therefore, an object of our invention to provide a new class of polymers which have an unusually high inherent sensitivity to radiation especially in the near visible region of the spectrum.

Another object is to provide a new class of polymers which not only have unusually good inherent spectral sensitivity but which can be optically sensitized with a large number of sensitizers to an unusually large degree. Another object is to provide light-sensitive film-forming polymers which are valuable for making photoresist materials that are unusually valuable for projection exposures made with tungsten illumination in glass optical systems.

Still another object is to provide a new class of photoresist materials that are valuable for making printed circuits, photoengraving plates, offset lithographs, etc.

Still further objects will become apparent from the following specification and claims.

These and other objects can be accomplished according to our invention by the use of film-forming light-sensitive polymers containing recurring alkapolyenoate groups.

The alkapolyenoate groups are represented advantageously by the formula

I.
$$R(CH{=}CH)_n\overset{O}{\overset{\|}{C}}{-}O{-}$$

wherein R represents an aromatic group, such as a phenyl group, e.g., phenyl, 4-methoxyphenyl, 2-methoxyphenyl, 3-methoxyphenyl, 2-ethoxyphenyl, 3,4-dimethoxyphenyl, 2,3-dimethoxyphenyl, 2,4-dimethoxyphenyl, 2,5-dimethoxyphenyl, 3,5-dimethoxyphenyl, 4-dimethylaminophenyl, 4-diethylaminophenyl, 4-chlorophenyl, 2-chlorophenyl, 3-bromophenyl, 4-bromophenyl, 3,4-dichlorophenyl, 2,4-dichlorophenyl, 3-nitrophenyl, 2,4-dinitrophenyl, 5-chloro-2-nitrophenyl, etc., a naphthyl group, e.g., 1-naphthyl, 2-naphthyl, 2-ethoxy-1-naphthyl, 2-methoxy-1-naphthyl, 4,8-dimethoxy-1-naphthyl, 2,7-dimethoxynaphthyl, 1,4-dimethoxy-2-naphthyl, 6-methoxy-2-naphthyl, 4-chloro-1-naphthyl, 2-chloro-1-naphthyl, 4-bromo-1-naphthyl, 5-bromo-1-naphthyl, 1-bromo-2-naphthyl, 5-bromo-2-naphthyl, 4-nitro-1-naphthyl, 1-nitro-2-naphthyl, etc., an anthranyl group, e.g., 9-anthranyl, 10-methyl-9-anthranyl, etc.; and a pyrenyl group; and a heterocyclic group, such as a 2-furyl group, e.g., 2-furyl, 5-methyl-2-furyl, 5-bromo-2-furyl, 5-chloro-2-furyl, 5-iodo-2-furyl, 5-nitro-2-furyl, etc.; a 2-thienyl group, e.g., 2-thienyl, 5-bromo-2-thienyl, 3,4-dichloro-2-thienyl, 5-nitro-2-thienyl, etc., a 1-methyl-2-pyrrolyl group, a pyridyl group, e.g., 2-pyridyl, 3-pyridiyl, 4-pyridyl, 6-methyl-2-pyridyl, etc., $n$ is the integer 2 or 3.

The alcohol portion of our polymers containing recurring alkapolyenoate groups can be furnished by any hydroxy-containing polymer. Especially useful hydroxy-containing polymers for the purposes of our invention are polyvinyl alcohol, its copolymers, cellulose and cellulose derivatives.

Our preferred polymers include from 5 to 100 mole percent of vinyl ester units of an acid selected from those having the formula:

$$R(CH{=}CH)_nC{\substack{\nearrow O \\ \searrow OH}}$$

in which R and $n$ are as defined previously, and from 0 to 95 mole percent of units of a monoethylenically-unsaturated monomer containing the radical:

$$-CH{=}C\langle$$

such as ethylene, vinyl acetate, vinyl benzoate, vinyl chloride, vinyl alcohol, vinyl cinnamate, methyl acrylate, etc.

Included among our film-forming light-sensitive polymers are those having recurring groups consisting of aromatic and heterocyclic substituted or unsubstituted alkapolyenoic acid esters of polyvinyl alcohol represented by the formula:

II.
$$\begin{array}{c}-(CH_2{-}CH){-}\\ \quad\ \ |\\ \quad\ \ O\\ \quad\ \ |\\ O{=}C{-}(CH{=}CH)_nR\end{array}$$

wherein R and $n$ are as defined previously, such that the said recurring groups comprise from 5 to 100 mol. percent of the polymer and the remainder consists of at least one intralinear group, such as an ethylene group; a vinyl alcohol group; a vinyl ester group in which the acyl group is derived from an alkanoic acid having from 1 to 18 carbon atoms, e.g., formic, acetic, bromoacetic, sulfoacetic, ethoxyacetic, o-nitrophenylacetic, p-nitrophenoxyacetic, propionic, β-chloropropionic, succinic, sulfosuccinic, glutaric, adipic, cyclohexanecarboxylic, sebacic, decanoic, stearic, 12-hydroxystearic, an alkenoic group having from 1 to 18 carbon atoms, e.g., acrylic, fumaric, methacrylic, crotonic, glutaconic, undecenoic, oleic, ricinoleic, cinnamic, m-sulfocinnamic, an alkapolyenoic group, e.g., linoleic, linolenic, etc., an aromatic carbonyl group from aromatic acids, such as benzoic, chlorobenzoic, p-nitrobenzoic, ethoxybenzoic, o-sulfobenzoic, phthalic, 3-nitrophthalic, salicylic, sulfosalicylic, bromoterephthalic, naphthoic, 4-chloro-1-hydroxy-2-naphthoic, 3-phenanthrene, etc., a heterocyclic carbonyl group from heterocyclic acids, such as 2-furoic, nicotinic, quinaldic, 7-chloro-4-hydroxy-3-quinolinecarboxylic etc., an esteramide of carbonic acid, such as carbamates formed by reaction of isocyanates with hydroxyl groups, e.g., carbethoxymethylcarbamate, etc., a vinyl acetal formed from aliphatic or aromatic aldehydes having from 1 to 18 carbon atoms, such as acetaldehyde, butyraldehyde, benzaldehyde, 4-chlorobenzaldehyde, 4-methoxybenzaldehyde, 4-dimethylaminobenzaldehyde, 1-naphthaldehyde, etc., and a vinyl ether.

Also included among our film-forming light-sensitive polymers are the aromatic and heterocyclic substituted or unsubstituted alkapolyenoic acid esters of cellulose derivatives.

Among the preferred film-forming light-sensitive polymers of our invention are the following illustrative examples which are not to be considered as limiting our invention.

Poly(vinyl cinnamylideneacetate)
Poly(vinyl benzoate cinnamylideneacetate)
Poly(vinyl cinnamate cinnamylideneacetate)
Poly(vinyl carbethoxymethylcarbamate cinnamylideneacetate)
Poly(vinyl acetate benzoate cinnamylideneacetate)
Poly(vinyl acetate cinnamylideneacetate)
Poly(vinyl acetate benzoate 7-phenyl-2,4,6-heptatrienoate)
Poly(ethylene vinyl cinnamylideneacetate)
Poly(vinyl butyral cinnamylideneacetate)
Cellulose acetate cinnamylideneacetate
Cinnamylideneacetate of hydroxyethyl cellulose These polymers are prepared by the esterification of hydroxy containing polymers with cinnamylideneacetyl chloride in an organic solvent such as pyridine. Modification reactions can be carried out with part of the hydroxyl groups of the polymers either before or after this esterification.

Our light-sensitive polymers containing recurring units of aromatic or heterocyclic substituted alkapolyenoate groups are distinguished from other polymers by having unexpectedly high sensitivity to radiation and especially to radiation of longer wavelengths, that is into the near visible and visible portions of the spectrum. The polymers of our invention are still further differentiated from some of the known polymers by the greater degree to which their sensitivity can be increased by optical sensitizers.

The following example will serve to illustrate these distinguishing properties with a typical homopolymer.

*Example I*

A coating dope was prepared consisting of a 2% solution of poly(vinyl cinnamylideneacetate) in chlorobenzene. This dope was whirl-coated horizontally at 78 r.p.m. on a silicated grained aluminum sheet. After drying, a portion of the coating was exposed to a 95-ampere carbon arc light through a silver step tablet having approximately 0.15 density unit increments. The exposed coating was then tray developed in chlorobenzene for 2 minutes to dissolve the uncrosslinked polymer. This was followed by a one minute rinse in fresh solvent and the image was dyed with Kodak Photoresist Dye Bath.

Another portion of this coating dope was sensitized by adding 10% by weight of N-phenylthioacridone. This was coated, exposed and developed as described to produce a good image of the silver step wedge. Coatings were made in the same manner for sensitized and unsensitized coating dopes containing poly(vinyl cinnamate) in place of the poly(vinyl cinnamylideneacetate). These coatings were exposed by the procedure described and given a standard development.

Relative speeds were determined for each of these coatings by comparison of the developed images in each coating with the image obtained in the coating of unsensitized poly(vinyl cinnamate) which was arbitrarily given a speed of 1.

The spectral sensitivity of these coatings was determined by exposing strips for 1 minute through a 1 mm. slit aperture in a spectrograph provided with a high pressure xenon arc continuous spectrum light source and a step wedge of Inconel metal on a quartz plate. After exposure, the strips were developed in chlorobenzene and dyed in the same manner as the sensitivity strips.

Relative speeds, the spectral sensitivity ranges and peaks for each of these coatings are given in Table I.

TABLE I

| Polymer | Sensitizer | Relative Speed | Spectral Sensitivity | |
|---|---|---|---|---|
| | | | Range, mμ | Peak, mμ |
| Poly(vinyl cinnamate | None | 1 | 250–340 | 320 |
| Do | N-phenylthio-acridone. | 5.5 | 260–340 | 320 |
| Poly(vinyl cinnamylidene-acetate). | None | 900 | 260–420 | 360 |
| Do | N-phenyl-thioacridone. | 1,800 | 280–520 | 340, 500 |

The relative speed of 900 for unsensitized poly(vinyl cinnamylideneacetate) is unexpected from the relative speed of 1 obtained for unsensitized poly(vinyl cinnamate) which differs from our polymer only by one

—(CH=CH)— group per ester group. Furthermore our coating had good sensitivity to radiation over a spectral range of 160 mμ compared to a spectral range of only 90 mμ for the poly(vinyl cinnamate) coating.

The advantage of our photoresist material sensitized with N-phenylthioacridone over the corresponding N-phenylthioacridone sensitized poly(vinyl cinnamate) is still more marked by the respective relative speeds of 1800 and 5.5, and the spectral sensitivity range of 240 mμ and 80 mμ. Our sensitized material is sensitive to radiation of wavelengths up to 520 mμ with a peak at 340 mμ and 500 mμ respectively compared with the poly(vinyl cinnamate) which is sensitive up to only 340 mμ and a peak of 320 mμ.

The following example will illustrate further how our polymers are differentiated from poly(vinyl cinnamate) in their ability to be spectrally sensitized by various sensitizers.

*Example II*

Coating dopes containing 2 percent polymer in chlorobenzene solution were made for poly(vinyl cinnamate), poly(vinyl benzoate cinnamylideneacetate), i.e., a 50–50 mol. percent copolymer poly(vinyl benzoate-co-vinyl cinnamylideneacetate), and poly(vinyl cinnamylideneacetate). Coatings were made on aluminum for each of these unsensitized dopes and for samples of dopes which were sensitized by adding 10 percent of the sensitizer indicated in Table II.

Spectrograms were made for each coating by exposure as described in Example I. The spectral sensitivity ranges for each coating are given in the following table:

TABLE II

| Polymers Sensitized with— | Poly(vinyl cinnamate) | Poly(vinyl benzoate cinnamylideneacetate) (50–50) | Poly(vinyl cinnamylideneacetate) |
|---|---|---|---|
| No sensitizer | 285–335 | 275–385 | 275–410 |
| N-phenylthioacridone | 260–340 | ---------- | 280–520 |
| Methyl(3-methyl-2-benzothiazolinylidene)dithioacetate | 300–330 | 280–500 | 280–500 |
| 2,6-bis(p-anisyl)-4-(p-n-amyloxyphenyl(thiapyrylium perchlorate | 290–330 | 280–580 | 280–580 |
| 2-benzoylmethylene-1-methyl-β-naphthothiazoline. | 300–335<br>340–450 | 290–460 | 285–460 |
| 2,6-bis(p-ethylphenyl)-4-phenylthiapyrylium perchlorate. | 290–335<br>360–500 | 275–530 | 280–525 |
| 2,6-bis(p-ethylphenyl)-4-(p-n-amyloxyphenyl)-thiapyrylium perchlorate. | 290–330<br>450–480 | 290–550 | 290–540 |
| 2,6-bis(p-ethylphenyl)-4-(p-n-amyloxyphenyl)-pyrylium perchlorate. | 290–340<br>390–480 | 280–510 | 280–510 |

The following example will further illustrate the valuable characteristics shown by photoresist materials coated with coating dopes made according to our invention.

*Example III*

Photoresist coatings were made from five different dopes consisting of 2% solutions of each polymer indicated in Table III. Coatings were also made of each of these dopes which had been sensitized with 10% of the sensitizer indicated in the Table III.

An unsensitized coating of poly(vinyl cinnamate) was made as above.

The relative speeds were determined for each of these coatings as described in Example I based on the speed of 1 for unsensitized poly(vinyl cinnamate).

Wedge spectrograms were made by the procedure described previously. Table III summarizes the relative speeds and spectral sensitivity ranges obtained.

TABLE III

| Polymer | Sensitizer | Relative Speed | Spectral Sensitivity Range in mμ |
|---|---|---|---|
| Poly(vinyl cinnamylideneacetate). | None | 800 | 280–440 |
| Do | 2,6-bis(p-ethylphenyl)-4-(p-n-amyloxyphenyl)thiapyrylium perchlorate. | 4,500 | 280–540 |
| Poly(vinyl cinnamate cinnamylideneacetate), 50–50 mol. percent. | None | 140 | 290–380 |
| Do | 2,6-bis(p-ethylphenyl)-4-(p-n-amyloxyphenyl)thiapyrylium perchlorate. | 2,000 | 290–540 |
| Poly(vinyl benzoate cinnamylideneacetate), 50–50 mol. percent. | None | 500 | 290–380 |
| Do | 2,6-bis(p-ethylphenyl)-4-(p-n-amyloxyphenyl)thiapyrylium perchlorate. | 6,500 | 280–540 |
| Poly(vinyl carbethoxymethylcarbamate cinnamylideneacetate), 50–50 mol. percent. | None | 650 | 280–390 |
| Do | 2,6-bis(p-anisyl)-4-(p-n-amyloxyphenyl)-thiapyrylium perchlorate. | 9,000 | 290–590 |
| Poly(vinyl acetate cinnamylidene-acetate). | None | 500 | 280–390 |
| Do | 4-p(-n-amyloxyphenyl)-2,6-bis-(4-ethylphenyl)thiapyrylium perchlorate. | 6,500 | 280–550 |

The following examples will further illustrate our invention by description of the synthesis used to prepare the polymers described in Examples 1, 2 and 3.

*Example IV*

*Poly (vinyl cinnamylideneacetate)*.—A mixture of 22 g. of polyvinyl alcohol and 200 ml. of pyridine was heated on a steam bath for 1 hour with stirring. After adding 200 ml. additional pyridine and cooling to 25° C., 96.3 g. of melted cinnamylideneacetyl chloride was added dropwise with stirring. After the temperature reached 50° C., it was maintained there with cooling. Addition of the acetyl chloride required about 15 minutes. The reaction mixture was then heated on a 50° bath for 4 hours with stirring. It was diluted with 800 ml. of acetone, precipitated into approximately 10 liters of water and washed 5 times with approximately 5 liter portions of water and 1 hour stirring periods. The product was then dried at room temperature in a vacuum oven. A yield of 90.7 grams (90.6%) was obtained.

Cinnamylideneacetic acid was prepared as follows:

250 grams of malonic acid, 317 g. of cinnamaldehyde and 200 g. of pyridine were mixed in the order given and stirred until solution occurred. Then 0.5 g. of piperidine was added and the mixture was allowed to stand at room temperature for one day. A solid cake of crystalline material formed. The mixture was then refluxed for 16 hours. After cooling, the solution was poured into cold dilute hydrochloric acid. The resulting solid was washed with water, and the wet filter cake crystallized from 650 ml. of ethyl alcohol to give 171 g. of cinnamylideneacetic acid, melting point 164–166° C.

Cinnamylideneacetyl chloride was prepared as follows:

The acid chloride was prepared according to the method of Staudinger and Schneider, Ber., 56, 706 (1923), and purified by distillation under reduced pressure as suggested by Alder, et al., Ann, 570, 247 (1950).

*Poly(vinyl cinnamate)*.—This polymer was prepared by the method described in U.S. Patent 2,610,120, mentioned earlier.

*Example V*

*Poly(vinyl benzoate cinnamylideneacetate)*.—A suspension of 22 g. of high molecular weight, completely hydrolyzed poly(vinyl alcohol) in 380 ml. of pyridine was swollen by heating on a steam bath. After cooling to 30° C., 59 g. of cinnamylideneacetyl chloride was added slowly maintaining the temperature below 50° C. Fifteen minutes after the addition was complete 34.1 g. of benzoyl chloride was added and the reaction mixture was heated at 50° C. for 4 hours. The reaction mixture was then diluted with 700 ml. of acetone and precipitated in cold water. After four water washes the polymer was dried under vacuum at room temperature.

*Example VI*

*Poly(vinyl carbethoxymethylcarbamate cinnamylideneacetate)*.—This polymer was prepared by the reaction described in Example VII using 58.9 g. of cinnamylideneacetyl chloride followed by 31.3 g. of carbethoxymethylisocyanate.

Sensitivity data for this polymer were summarized previously in Table III.

The following examples will further illustrate our invention by description of other representative examples of our polymers including their synthesis. These are not to be considered as limiting our invention.

*Example VII*

*Poly(vinyl cinnamate cinnamylideneacetate)*.—To a mixture of 22 g. of a medium molecular weight poly(vinyl alcohol) which had been swollen in 380 ml. of pyridine by heating on a steam bath overnight was slowly added 51 g. of cinnamoyl chloride at 30–40° C. This was calculated to give 50 mol. percent cinnamoylation and react with the water present in the pyridine and the poly (vinyl alcohol). Ten minutes after the addition had been completed 46.7 g. of cinnamylideneacetyl chloride was added keeping the temperature below 50° C. The reaction mixture was then heated at 50° C. for 4 hours. The dope was then diluted with 700 ml. of acetone and precipitated into cold water. The polymer was washed four times with water and dried in the vacuum oven at room temperature over calcium chloride.

A 7% dope of the polymer in a mixture of three parts of methyl Cellosolve acetate and one part of cyclohexanone sensitized with 2% of 4-(p-n-amyloxyphenyl)-2,6-bis(p-ethylphenyl)thiapyrylium perchlorate gave coatings on copper or other metals with high sensitivity for printed circuit or other applications. For example, such a coating could be given an exposure of about 500 foot candle minutes to a projected tungsten light image enlarged 8 times the original negative size. Previously described light-sensitive polymers would require considerably longer exposures and in many cases would require an ultraviolet light source. Following the exposure, the coating was developed in a vapor degreaser with trichloroethylene to give a high quality resist image suitable for further treatment such as etching or printing depending on the application desired.

Sensitivity data for this polymer are summarized in Table III.

The results of variation of the cinnamate-cinnamylideneacetate ratio on sensitivity are shown in Table IV. The various copolymers were made by appropriate adjustments in the amounts of cinnamoyl chloride and cinnamylideneacetyl chloride used in the reaction described. The relative speeds given are compared to unsensitized poly(vinyl cinnamate) made from a Du Pont medium molecular weight poly(vinyl alcohol), Elvanol 90–25, which was arbitrarily given a value of 1. The polymer samples in Table IV were prepared from another medium molecular weight poly(vinyl alcohol), Du Pont Elvanol 71–30. Poly(vinyl cinnamate) prepared from this poly (vinyl alcohol) has approximately half the sensitivity of that made from the earlier mentioned starting polymer.

TABLE IV

| Mole Percent | | Relative Speeds | |
|---|---|---|---|
| Cinnamate | Cinnamylideneacetate | Unsensitized | Sensitized |
| 100 | 0 | 0.4 | 320 |
| 90 | 10 | 28 | 500 |
| 75 | 25 | 55 | 1,600 |
| 60 | 40 | 140 | 2,000 |
| 40 | 60 | 400 | 3,200 |
| 25 | 75 | 650 | 4,500 |
| 10 | 90 | 800 | 4,500 |
| 0 | 100 | 800 | 4,500 |

The polymers listed in the above table were sensitized with 2,6-bis[p-ethylphenyl]-4-(p-amyloxyphenyl)thiapyrylium perchlorate.

*Example VIII*

*Poly(vinyl acetate benzoate cinnamylideneacetate)*.—A suspension of 25 g. of a high molecular weight 88% hydrolyzed poly(vinyl alcohol) in 380 ml. of pyridine was swollen by heating on a steam bath. After cooling to 30° C., 16 g. of cinnamylideneacetyl chloride was added slowly maintaining the temperature below 50° C. Fifteen minutes after the addition was completed, 55 g. of benzoyl chloride was added. The amounts of the acid chlorides were calculated, taking into account the moisture in the poly(vinyl alcohol) and the pyridine to give a composition of 10 mole percent cinnamylideneacetate, 78 mole percent benzoate and the 12 mole percent acetate. The reaction mixture was then heated with stirring at 50° C. for 4 hours. After cooling and diluting with 700 ml. of acetone the polymer was precipitated into water, given 4 washes with water and dried in a vacuum oven at room temperature over calcium chloride.

Poly(vinyl acetate benzoate cinnamylideneacetate) samples were also prepared having 50 mole percent vinyl cinnamylideneacetate, 38 mole percent vinyl benzoate and 12 mole percent vinyl acetate, and also 88 mole percent vinyl cinnamylideneacetate, 0 mole percent vinyl benzoate and 12 mole percent vinyl acetate by using the appropriate amounts of benzoyl chloride and cinnamylideneacetyl chloride in the synthesis described.

Dopes containing 2 percent polymer in chlorobenzene were prepared for each of these three poly(vinyl acetate benzoate cinnamylideneacetate) polymers. These dopes were coated on sheets of aluminum. Coatings were also made of these same dopes which were sensitized with 10 weight percent (based on the weight of polymer) of 4-(p-n - amyloxyphenyl)2,6 - bis(p-ethylphenyl)thiapyrylium perchlorate.

These coatings were exposed as described in Example 1 and developed in chlorobenzene. Relative speed values were determined for each of the samples. The data are summarized in the following Table V.

TABLE V

| Polymer Composition (mol percent) | | | Relative Speed | |
|---|---|---|---|---|
| Vinyl cinnamylideneacetate | Vinyl Benzoate | Vinyl Acetate | Unsensitized | Sensitized |
| 10 | 78 | 12 | 100 | 3,200 |
| 50 | 38 | 12 | 500 | 8,000 |
| 88 | 0 | 12 | 1,000 | 9,000 |

A 10 percent dope of poly(vinyl acetate benzoate cinnamylideneacetate), 12 mol. percent acetate, 78 mol. percent benzoate, and 10 mol. percent cinnamylideneacetate, in a mixture of three parts of n-butyl acetate and two parts of cyclohexanone to which was added 2 percent of poly(vinyl) alcohol acetate cinnamylideneacetate), 33 mol. percent vinyl alcohol, 12 mol. percent acetate and 55 mol. percent cinnamylideneacetate, sensitized with 2 percent of the above-mentioned sensitizer, gave coatings on copper or other metals with high sensitivity for printed circuit or other applications.

In still another embodiment of our invention a 3 percent dope of poly(vinyl acetate benzoate cinnamylideneacetate) in methyl ethyl ketone was coated at a thickness of 0.004 inch on a sheet of Mylar polyester film made by Du Pont. The dried coating was exposed for about 3 to 6 seconds through a positive transparency using a sunlamp at a distance of 14 inches. The image was developed by washing the element in methyl ethyl ketone. The unexposed, or areas not crosslinked, were removed in the development leaving a negative opaque blushed image.

*Example IX*

*Poly(vinyl acetate cinnamylideneacetate)*.—This polymer was prepared in the same manner as the poly(vinyl acetate benzoate cinnamylidene acetate) described in Example VIII using acetic anhydride in place of benzoyl chloride in an amount calculated to give 50 mol. percent acetate. Coated from and developed in chlorobenzene, this sample and a sample sensitized with 4-(p-n-amyloxyphenyl)-2,6-bis(p-ethylphenyl) - thiapyrylium perchlorate gave the relative speeds and spectral sensitivities summarized previously in Table III.

*Example X*

*Poly(vinyl acetate benzoate 7-phenyl-2,4,6-heptatrienoate)*.—This polymer was prepared by the same procedure used in Example VIII using 7-phenyl-2,4,6-heptatrienoyl chloride in place of cinnamylideneacetyl chloride. Amounts of reactants were used to give a polymer containing 12 mol percent acetate, 48 mol percent benzoate, and 40 mol percent of the phenylheptatrienoate.

A 2 percent solution of the resulting polymer in chlorobenzene coated on aluminum when exposed to a sunlamp through a line negative, followed by development in chlorobenzene and dyeing gave a positive image.

The 7-phenyl-2,4,6-heptatrienoyl chloride, M.P. 90° C., was prepared from the corresponding acid in the same manner as cinnamylideneacetyl chloride. The 7-phenyl-2,4,6-heptatrienoic acid was prepared in the following manner: To a solution of sodium methoxide from 7.7 g. of sodium in 200 ml. of methanol was added with stirring during 10 minutes a solution of 26.4 g. of 5-phenyl-2,4-pentaidenol, J. of Gen. Chem. (USSR) 29, 2526 (1959), 37.3 g. of O,O-diethylcarbethoxymethylphosphonate and 50 ml. of methanol. After refluxing this mixture for 2½ hours, it was diluted with 25 ml. of distilled water and refluxed 2½ hours longer. The product was isolated by cooling and pouring slowly with vigorous stirring into a mixture of 50 ml. concentrated hydrochloric acid, 500 ml. of distilled water and 200 g. crushed ice. The solid was collected, washed with water, dried under vacuum at 50° C. and recrystallized from 300 ml. of toluene to give 15.2 g. of product melting at 190–193° C.

*Example XI*

A copolymer of vinylacetate and ethylene was prepared as described in Example I of Minsk et al. U.S. Patent 2,801,233, granted July 30, 1957, containing approximately 10 mol percent of ethylene. The polymer was deacetylated in the manner described in the same example to give a copolymer of vinyl alcohol and ethylene also containing about 10 mol percent of the latter component. This was a white, fibrous polymer.

Ten grams of this copolymer was heated for 4 hours in 100 ml. of dry pyridine on a steam bath. Upon cooling to 40° C., 50 g. of cinnamylideneacetyl chloride was added portionwise with stirring. The reaction mixture was then heated for 4 hours at 50° C. The polymer was isolated by diluting with 2 volumes of acetone, precipitating into water, washing several times with water and drying at room temperature in vacuo in the dark.

A coating of the polymer on brushed aluminum obtained from a 2 percent solution in chlorobenzene when exposed to a sunlamp through a line negative, followed by development in chlorobenzene and dyeing gave a positive image. The sensitivity of the polymer was greatly enhanced when sensitized with various sensitizers.

*Example XII*

*Poly(vinylbutyral cinnamylideneacetate)*.—Ten grams of a poly(vinylbutyral) containing 22 percent by weight of vinyl alcohol units was dissolved in 100 ml. of pyridine and treated as in Example XI with 13 g. of cinnamylideneacetyl chloride.

A coating of the resulting polymer was light sensitive, forming an image following the usual steps of exposure, solvent development and dyeing.

The following examples illustrate typical representative polymers in which a cellulose or a cellulose derivative is esterified with an alkapolyenoic acid.

*Example XIII*

*Cellulose acetate cinnamylideneacetate*.—To a solution of 11.8 g. (0.05 mole) of cellulose acetate (32.4 percent Ac) in 100 ml. of pyridine was added 19.3 g. (0.1 mole) cinnamylideneacetyl chloride dropwise with stirring. The temperature rose to 56° C. The reaction mixture was then heated at 50° C. for 4 hours. The reaction dope was then diluted with 200 ml. of acetone and precipitated into 3 l. of water. The resulting polymer was washed four times with water and dried in a vacuum oven at room temperature. When tested in the usual manner for light sensitivity, this sample gave a relative speed of 80.

*Example XIV*

*Cinnamylideneacetate of hydroxyethyl cellulose*.—A mixture of 6.2 g. of hydroxyethyl cellulose (carbide and carbon, Cellosize WP–3) and 75 ml. of pyridine was heated on a steam bath with stirring. After cooling to room temperature 17.3 g. of cinnamylideneacetyl chloride was added dropwise with stirring in 15 minutes. During the addition, the temperature was maintained at approximately 50° C. with cooling. After addition was complete, the reaction mixture was heated in a 50° C. bath for 4 hours. It was then diluted with 190 ml. of acetone and precipitated into 2 l. of water. The polymer was washed 4 times with water and dried in a vacuum oven at room temperature. On testing for light sensitivity, it gave a relative speed of 450.

Other hydroxyl containing polymers such as the naturally occurring materials cellulose, starch, guar, alginic acid or their partially esterified or etherified derivatives, such as cellulose acetates, propionates or butyrates, mixed acetate-butyrates, hydroxyethyl cellulose, ethyl cellulose, etc., are esterified by reaction with alkapolyenoic chlorides to produce polymers according to our invention.

The acid chlorides concerned are also capable of reacting with polymers containing amino groups, such as poly(vinylamine) copolymers, poly(vinylanthranilate), poly(aminostyrene), etc., as well as with naturally occurring polymers, such as gelatin to give the corresponding light-sensitive amide derivatives.

Our film-forming light-sensitive compositions are made by dissolving one or more of our polymers in any suitable solvent or combination of solvents used in the art to prepare polymer dopes. The selection of doping solvents is restricted to solvents which will produce satisfactory coatings under the conditions used. The solvent should have a low enough boiling point so as to dry down without excessive whirling time but should have a high enough boiling point not to cause "blush" from moisture condensation due to too rapid evaporation. Solvents that are used to advantage include methyl Cellosolve acetate, n-butyl acetate, 2-methoxymethyl acetate, acetone, methylethyl ketone, 2-butanone, 2,5-hexanedione, cyclohexanone, benzene, toluene, chlorobenzene, α-chlorotoluene, methylene chloride, tetrachloroethane, etc. The same solvents or solvent mixtures are used to advantage in the wash-off development of photoresist materials coated with our light-sensitive compositions.

Our polymers are used to advantage in the light-sensitive compositions in the range from about 1 to 20 percent by weight. The preferred range is from 2 to 10 percent by weight.

Our compositions are advantageously sensitized by adding sensitizer from about 0.1 to 10 percent by weight of the polymer. The preferred range is from about 0.5 to 3 percent of sensitizer based on the weight of polymer. Any sensitizers used in the art to optically sensitize polymers may be used to sensitize our compositions. These sensitizers include the aromatic nitro sensitizer compounds described in Minsk et al. U.S. Patent 2,610,120, granted Sept. 9, 1952, such as p-nitroaniline, 2,4,6-trinitroanline, 2-chloro-4-nitroaniline, 2,6-dichloro-4-nitroaniline, etc., the anthrones, benzanthrones and azabenzanthrones described in Minsk et al. U.S. Patent 2,670,285, granted Feb. 23, 1954, such as anthrone, 2-keto-methyl-3-azo-1,9-benzanthrone, 1-carbethoxy-2-keto-3-methyl-3-azabenzanthrone, etc., the quinones described in Minsk et al. U.S. Patent 2,670,286, granted Feb. 23, 1954, such as 1,2-benzanthraquinone, 2-methyl-1,4-naphthoquinone, β-phenylanthraquinone, 2,3-diphenylanthraquinone, etc., the diaminobenzophenone imides, the diaminodiphenylmethanes, the diaminodiphenyl ketones and the diaminodiphenylcarbinols described by Minsk et al. U.S. Patent 2,670,287, granted Feb. 23, 1954, such as 4,4′-tetramethyldiamino benzophenone imide, 4,4′-diamino-3,3′-di-o-tolylmethane, 4,4′-tetramethyldiaminobenzophenone, 4,4′-tetramethyldiaminodiphenylcarbinol, etc., the triphenylmethanes described by Minsk et al. U.S. Patent 2,690,966, granted Oct. 5, 1954, such as Crystal Violet (Schultz No. 785), Malachite Green (Schultz No. 754), Victoria Blue B (Schultz No. 822), etc., the thiazoles and related cyanine dyes described by Robertson et al. U.S. Patent 2,732,301, granted Jan. 24, 1956, such as 2-propionylmethylene-1-methyl-β-naphthothiazole, 2-(m-chlorobenzoylmethylene)-1-methyl - β - naphthothiazole, 2-benzoylmethylene-1-methyl-β - naphthothiazole, etc.

Sensitizers particularly advantageous for optically sensitizing our polymers are the pyrylium and thiapyrylium salts described in the Van Allan, Natale and Rauner U.S. patent application, Ser. No. 146,743, filed Oct. 23, 1961, entitled Light-Sensitive Layers Containing Pyrylium and Thiapyrylium Salts, filed simultaneously with the immediate application, such as 2,6-bis(p-ethylphenyl)-4-(p-n-amyloxyphenyl)thiapyrylium perchlorate, 2,6-bis(p-anisyl)-4-(p-n-amyloxyphenyl)thiapyrylium perchlorate, etc., and the 4-oxo-1,4a-diazaphthalenes, the 4a-azanaphthalenes, the 4-oxo-1-thia-3a,7-diazaindenes and the acridones described in Reynolds et al. U.S. Ser. No. 51,695, filed Aug. 24, 1960, now U.S. Patent No. 3,072,485, entitled Optically Sensitized Azido Polymers for Photomechanical Resist Compositions, such as 3-carbethoxy-6-chloro-4-oxo-1,4a-diazanaphthalene, 6-ethyl-4-oxo-4a-azanaphthalene, 4-oxo-1-thia-3a,7-diazaindene, N-methylacridone, etc.

Other addenda may be added to our compositions, such as, for example, antioxidants. Antioxidants that are used to advantage with our poly(vinyl cinnamylideneacetate) polymers include hydroquinone and Tenox antioxidant, a butylate hydroxyanisole available from Eastman Chemical Products Inc. These compounds are used in amounts ranging from 0.1 to 2 percent of the polymer weight to improve the stability of the coating dopes.

As in the case of the poly(vinyl cinnamates) (see U.S. 2,739,892), we have found that the adhesion to metal surfaces of essentially completely esterified cinnamylideneacetate polymers can be modified either (a) by the addition to the essentially completely esterified ester of 1–50% by weight of a partially esterified cinnamylideneacetate polymer containing poly(vinyl alcohol) groups in the range of about 20–50 mol %, or (b) by the use of a partially esterified cinnamylideneacetate polymer containing free hydroxy groups in approximately 5 to 20 mol percent amounts alone.

Our invention is still further illustrated by the accompanying drawing FIG. 1, FIG. 2 and FIG. 3. Each drawing represents a wedge spectrogram for a photoresist material.

FIG. 1 represents the wedge spectrogram for a photoresist element coated with unsensitized 2 percent poly(vinyl acetate benzoate cinnamylideneacetate) in chlorobenzene.

FIG. 2 represents the wedge spectrogram for a photoresist element coated with 2 percent poly(vinyl acetate benzoate cinnamylideneacetate) in chlorobenzene sensitized with 10 percent (of weight of polymer) of 4-(p-amyloxyphenyl)-2,6-bis(4-ethylphenyl)thiapyrylium perchlorate.

FIG. 3 represents the wedge spectogram for a photoresist element coated with 2 percent poly(vinyl acetate benzoate cinnamylideneacetate) in chlorobenzene sensitized with 10 percent (of weight of polymer) of 4-(p-amyloxyphenyl)-2,6 - bis(p-methoxyphenyl)thiapyrylium perchlorate.

The film-forming light-sensitive polymers containing recurring alkapolyenoate groups are distinguished from other polymer compositions by having unexpectedly high sensitivity to radiation especially in the near visible portions of the spectrum. For example, our photoresist elements coated with a composition containing unsensitized poly(vinyl cinnamylideneacetate) gave relative speeds that are 900 times higher than corresponding photoresist elements coated with a composition containing the prior art, unsensitized poly(vinyl cinnamate). This photoresist element of our invention had a spectral sensitivity range of 160 mμ compared to the prior art range of 90 mμ. Photoresist elements coated with our polymer compositions are further distinguished from the corresponding prior art compositions by being capable of sensitization with a wide range of sensitizers to much higher relative speeds and to radiation of substantially longer wavelengths.

The greatly increased sensitivity and spectral sensitivity of photoresist elements coated with sensitized cinnamylideneacetate polymers over photoresist elements coated with previously known light-sensitive polymers makes it possible and practical to use incandescent light sources for exposures and projection printing through glass optics. Projection exposures allow the enlargement or reduction of an image to be made readily on planar or uneven surfaces. This process will make possible many applications which formerly were impossible, extremely difficult, inconvenient, or uneconomical.

The invention has been described in detail with particular reference to preferred embodiments thereof, but it will be understood that variations and modifications can be effected within the spirit and scope of the invention as described hereinabove and as defined in the appended claims.

We claim:

1. A film-forming light-sensitive polymer derived from those selected from the class consisting of a homopolymer of vinyl alcohol, a copolymer of vinyl alcohol, and a cellulose, said polymer containing recurring alkapolyenoate groups having the formula:

$$R(CH=CH)_n\overset{O}{\overset{\|}{C}}-O-$$

wherein R represents a group selected from the class consisting of a phenyl group, a naphthyl group, an anthranyl group, a pyrenyl group a 2-furyl group, a 2-thienyl group, a 1-methyl-2-pyrrolyl group, and a pyridyl group, and $n$ is an integer from 2 to 3, said alkapolyenoate groups being attached directly to carbon atoms in the chain of said polymer.

2. A film-forming light-sensitive polymer consisting of an ester of (1) a hydroxy containing polymer selected from the class consisting of a homopolymer of vinyl alcohol, a copolymer of vinyl alcohol and a cellulose, and (2) a compound having the formula:

$$R(-CH=CH)_n-\overset{O}{\overset{\|}{C}}-Cl$$

wherein R represents a group selected from the class consisting of a phenyl group, a naphthyl group, an anthranyl group, a pyrenyl group, a 2-furyl group, a 2-thienyl group, a 1-methyl-2-pyrrolyl group, and a pyridyl group, and $n$ is an integer from 2 to 3.

3. A film-forming light-sensitive polymer derived from those selected from the class consisting of a homopolymer of vinyl alcohol, a copolymer of vinyl alcohol, and a cellulose, said polymer containing recurring vinyl alkapolyenoate groups selected from those having the formula:

$—(CH_2—CH)—$
$|$
$O$
$|$
$O=C(—CH=CH_nR$ wherein R represents a group selected from the class consisting of a phenyl group, a naphthyl group, an anthranyl group, a pyrenyl group, a 2-furyl group, a 2-thienyl group, a 1-methyl-2-pyrrolyl group, and a pyridyl group, and $n$ is an integer from 2 to 3.

4. A film-forming light-sensitive polymer consisting of from 5 to 100 mol percent of vinyl alkapolyenoate groups selected from those having the formula:

$—(CH_2—CH)—$
$|$
$O$
$|$
$O=C(—CH=CH)_nR$ wherein R represents a group selected from the class consisting of a phenyl group, a naphthyl group, an anthranyl group, a pyrenyl group, a 2-furyl group, a 2-thienyl group, a 1-methyl-2-pyrrolyl group, and a pyridyl group, an $n$ is an integer from 2 to 3, and from 0 to 95 mol percent of units of a monoethylenically-unsaturated monomer selected from the class consisting of ethylene, vinyl alcohol, vinyl chloride, a vinyl ester, a vinyl acetal, a vinyl ether, and methyl acrylate.

5. A film-forming light-sensitive polymer derived from those selected from the class consisting of a homopolymer of vinyl alcohol, a copolymer of vinyl alcohol, and a cellulose, said polymer having recurring groups selected from the formula:

$—(CH_2—CH)—$
$|$
$O$
$|$
$O=C(—CH=CH)_n—R$ wherein R represents a group selected from the class consisting of a phenyl group, a naphthyl group, an anthranyl group, a pyrenyl group, a 2-furyl group, a 2-thienyl group, a 1-methyl-2-pyrrolyl group, and a pyridyl group, and $n$ is an integer from 2 to 3, such that said recurring group comprises from 5 to 100 mol percent of the said polymer and the remainder consists of intralinear groups selected from the class consisting of ethylene, vinyl alcohol, vinyl chloride, a vinyl ester, a vinyl acetal group, a vinyl ether group and methyl acrylate.

6. A poly(vinyl cinnamylideneacetate).

7. A copolymer of vinyl cinnamate and vinyl cinnamylideneacetate.

8. A copolymer of vinyl acetate, vinyl benzoate, and vinyl cinnamylideneacetate.

9. A copolymer of vinyl carbethoxymethylcarbamate and vinyl cinnamylideneacetate.

10. A copolymer of vinyl acetate and vinyl cinnamylideneacetate.

11. A film-forming light-sensitive composition containing a solvent and from about 1 to 20 percent by weight of a light-sensitive polymer derived from those selected from the class consisting of a homopolymer of vinyl acohol, a copolymer of vinyl alcohol, and a cellulose, said polymer containing recurring vinyl alkapolyenoate groups.

12. A film-forming light-sensitive composition containing a solvent and from about 1 to 20 percent by weight of a light-sensitive polymer derived from those selected from the class consisting of a homopolymer of vinyl alcohol, a copolymer of vinyl alcohol, and a cellulose, said polymer containing recurring groups of the formula:

$—(CH_2—CH)—$
$|$
$O$
$|$
$O=C(—CH=CH)_nR$ wherein R represents a group selected from the class consisting of a phenyl group, a naphthyl group, an anthranyl group, a pyrenyl group, a 2-furyl group, a 2-thienyl group, a 1-methyl-2-pyrrolyl group, and a pyridyl group, and $n$ is an integer from 2 to 3, such that said recurring group comprises from 5 to 100 mol percent of the said polymer and the remainder consists of intralinear groups selected from the class consisting of ethylene, vinyl alcohol, vinyl chloride, a vinyl ester, a vinyl acetal, a vinyl ether, and methyl acrylate.

13. A film-forming light-sensitive composition containing a solvent and from about 1 to 20 percent of a poly(vinyl cinnamylideneacetate).

14. A film-forming light-sensitive composition containing a solvent and from 1 to 20 percent of a copolymer of vinyl cinnamate and vinyl cinnamylideneacetate.

15. A film-forming light-sensitive composition containing a solvent and from about 1 to 20 percent of a copolymer of vinyl acetate, vinyl benzoate and vinyl cinnamylideneacetate.

16. A film-forming light-sensitive composition containing a solvent and from about 1 to 20 percent of a copolymer of vinyl carbethoxymethylcarbamate and vinyl cinnamylideneacetate.

17. A film-forming light-sensitive composition containing a solvent and from about 1 to 20 percent of a copolymer of vinyl acetate and vinyl cinnamylideneacetate.

18. A film-forming light-sensitive composition of claim 12 containing from 0.1 to 10 percent based on the weight of said polymer of an optical sensitizer selected from the class consisting of an aromatic nitro sensitizer compound, an anthrone, a benzanthrone, an azabenzanthrone, a quinone, a diaminobenzophenone imide, a diaminodiphenylmethane, a diaminodiphenyl ketone, a diaminodiphenylcarbino, a triphenylmethane, a thiazole, a pyrylium salt, a thiapyrylium salt, a 4-oxo-1,4a-diazaphthalene, a 4a-azanaphthalene, a 4-oxo-1-thia-3a,7-diazaindene and an acridone.

19. A film-forming light-sensitive coating composition comprising a mixture of (1) a copolymer of vinyl acetate, vinyl benzoate, and vinyl cinnamylideneacetate, and (2) a copolymer of vinyl alcohol, vinyl acetate and vinyl cinnamylideneacetate.

20. A film-forming light-sensitive polymer consisting of an ester of (1) a cellulose derivative and (2) an acid chloride selected from those having the formula:

$$R(CH=CH)_n\overset{\overset{O}{\|}}{C}—Cl$$

wherein R represents a group selected from the class consisting of a phenyl group, a naphthyl group, an anthranyl group, a pyrenyl group, a 2-furyl group, a 2-thienyl group, a 1-methyl-2-pyrrolyl group, and a pyridyl group, and $n$ is an integer from 2 to 3.

21. A light-sensitive photographic element comprising a support having coated thereon a layer of a light-sensitive polymer derived from those selected from the class consisting of a homopolymer of vinyl alcohol, a copolymer of vinyl alcohol, and a cellulose, said polymer containing recurring vinyl alkapolyenoate groups selected from those having the formula:

$—(CH_2—CH)—$
$|$
$O$
$|$
$O=C—(CH=CH)_nR$ wherein R represents a group selected from the class consisting of a phenyl group, a naphthyl group, an anthranyl group, a pyrenyl group, a 2-furyl group, a 2-thienyl group, a 1-methyl-2-pyrrolyl group, and a pyridyl group, and *n* is an integer from 2 to 3.

References Cited by the Examiner

UNITED STATES PATENTS

| | | | |
|---|---|---|---|
| 2,666,701 | 1/1954 | West | 96—115 |
| 2,670,286 | 2/1954 | Minsk et al. | 260—89.3 |
| 2,670,287 | 2/1954 | Minsk et al. | 96—115 |
| 2,725,372 | 11/1955 | Minsk. | |
| 2,941,988 | 6/1960 | Wolf. | |
| 2,956,878 | 10/1960 | Michiels et al. | 96—33 |

OTHER REFERENCES

Blicke, J. Am. Chem. Cov., vol, 45, pp. 1562–1566, (June 1923).

NORMAN G. TORCHIN, *Primary Examiner.*

PHILIP E. MANGAN, JOSEPH L. SCHOFER, *Examiners.*

R. L. STONE, H. WONG, R H. SMITH, *Assistant Examiners.*

UNITED STATES PATENT OFFICE
CERTIFICATE OF CORRECTION

Patent No. 3,257,664 June 21, 1966

Gerhard W. Leubner et al.

It is certified that error appears in the above identified patent and that said Letters Patent are hereby corrected as shown below:

Column 13, lines 12 to 15, in the structural formula, that part of the structure in line 15 that reads "$(-CH=CH_nR$" should read -- $(-CH=CH)_nR$ --; line 34, "an", first occurrence, should read -- and --.

Signed and sealed this 5th day of May 1970.

(SEAL)
Attest:

Edward M. Fletcher, Jr.
Attesting Officer

WILLIAM E. SCHUYLER, JR.
Commissioner of Patents